(12) United States Patent
Bereza

(10) Patent No.: US 8,125,362 B1
(45) Date of Patent: Feb. 28, 2012

(54) APPARATUS AND ASSOCIATED METHODS FOR GENERATING REFERENCE SIGNALS

(75) Inventor: William W. Bereza, Nepan (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/334,219

(22) Filed: Dec. 12, 2008

(51) Int. Cl.
 *H03M 3/00* (2006.01)
(52) U.S. Cl. .................. 341/143; 341/144; 341/155
(58) Field of Classification Search .............. 341/118, 341/120, 144, 143, 155, 156
 See application file for complete search history.

(56) References Cited

U.S. PATENT DOCUMENTS

| | | | |
|---|---|---|---|
| 6,255,974 B1 * | 7/2001 | Morizio et al. .............. 341/143 |
| 6,556,158 B2 * | 4/2003 | Steensgaard-Madsen .... 341/131 |
| 6,628,216 B2 * | 9/2003 | Allen et al. ................ 341/120 |
| 7,129,875 B1 * | 10/2006 | Altun et al. ................ 341/143 |
| 7,446,687 B2 * | 11/2008 | Lin ............................ 341/143 |
| 7,450,665 B2 * | 11/2008 | Guimaraes ................. 375/319 |
| 7,625,525 B2 * | 12/2009 | Cortelazzo ................. 422/65 |

OTHER PUBLICATIONS

Bernhard E. Boser et al., "The Design of Sigma-Delta Modulation Analog-to-Digital Converters," IEEE Journal of Solid-State Circuits, vol. 23, No. 6, pp. 1298-1308 (1985).
James C. Candy, "A Use of Double Integration in Sigma Delta Modulation," IEEE Transactions on Communications, vol. COM-33, No. 3, pp. 249-258 (1985).
James C. Candy, "A Use of Limit Cycle Oscillators to Obtain Robust Analog-to-Digital Converters," IEEE Transactions on Communications, vol. COM-22, No. 3, pp. 298-305 (1974).

* cited by examiner

*Primary Examiner* — Brian Young
(74) *Attorney, Agent, or Firm* — Law Offices of Maximilian R. Peterson

(57) ABSTRACT

An integrated circuit (IC) includes a reference circuit. The reference circuit includes at least one controlled current source. The reference circuit further includes a sigma-delta modulator coupled to the at least one controlled current source.

29 Claims, 13 Drawing Sheets

APPARATUS AND ASSOCIATED METHODS FOR GENERATING REFERENCE SIGNALS

TECHNICAL FIELD

The disclosed concepts relate generally to reference sources and, more particularly, to apparatus for reference sources with relatively high precision, and associated methods.

BACKGROUND

Modern integrated circuits (ICs) often include a relatively large number of transistors and building blocks. As a result, designers and manufacturers continue to seek ways to reduce the design cycle times of the ICs. As one way of doing so, designers increasingly use digital circuitry to accomplish the tasks once reserved for analog circuits.

Nevertheless, some analog circuitry continues to remain on ICs. It becomes harder to maintain the analog circuitry as the migration with the scaling of digital circuits continues, because of relative mismatches. Furthermore, because of their nature, the analog circuitry, and some of the digital circuitry, use reference sources, for example, as a source of bias signals, etc.

SUMMARY

The disclosed concepts relate to apparatus and associated methods for generate reference signals, for example, in integrated circuits (ICs). In one exemplary embodiment, an IC includes a reference circuit. The reference circuit includes at least one controlled current source, and a sigma-delta modulator coupled to the at least one controlled current source.

In another exemplary embodiment, an apparatus includes a sigma-delta modulator used in a feedback loop. The sigma-delta modulator is used to correct at least one error component corresponding to at least one reference signal.

In yet another exemplary embodiment, a method of generating at least one reference signal includes using a sigma-delta modulator in a feedback loop. The sigma-delta modulator is used to generate at least one correction signal corresponding to the at least one reference signal. The method further includes using the at least one correction signal to generate the at least one reference signal.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
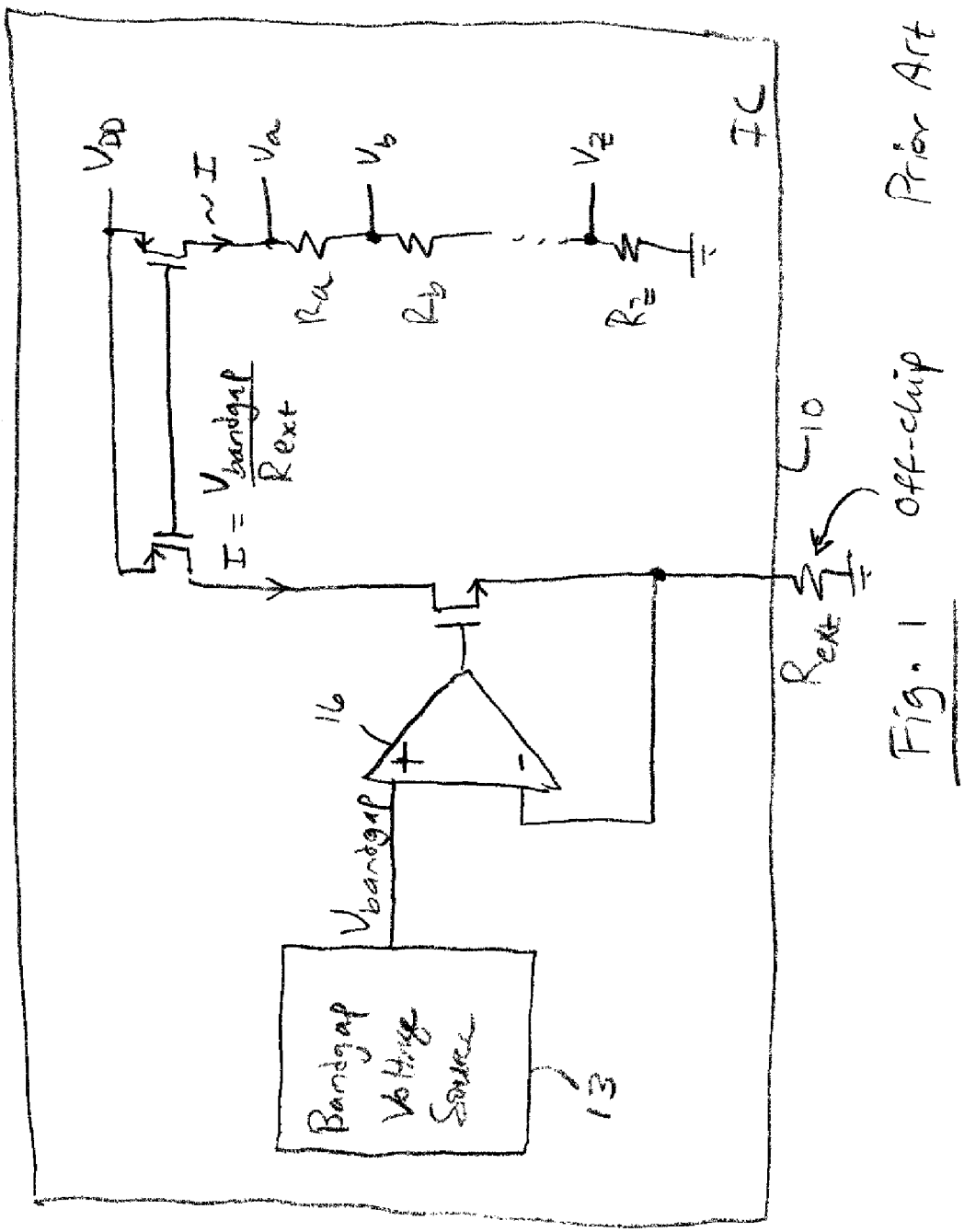
FIG. 1 illustrates a conventional reference circuit that uses a bandgap voltage source.

The disclosed concepts relate generally to reference circuits, for example, as sources of bias and/or reference signals in electronic circuitry, such as integrated circuits (ICs). In exemplary embodiments, the disclosed concepts provide apparatus and methods for reference circuits with high relative precision, and associated methods.

There is an increasing interest in replacing analog circuits with digital equivalents particularly as process node geometries decrease. Examples include digital phase locked loops (PLLs) and clock data recovery circuits (CDRs) for clock synthesis and clock/data recovery, digital signal processors (DSPs) to replace analog filters, and so on.

Several motivations exist for designing digital equivalent circuits of analog circuits. Examples include a shorter design cycle, advantages associated with porting existing designs (digital circuits scale well, analog circuits do not scale as well), and having the alternative to avoid dealing with a loss of intrinsic gain in analog devices at smaller process geometries as well as other analog non-ideal behavior that get aggravated with smaller device geometries.

Nevertheless, one will likely design and use analog circuits in the foreseeable future to which no digital equivalents exist. For them, their designs become harder to maintain as we migrate with scaling digital processes. The reason is that the effect of relative mismatch and overcoming it becomes increasingly difficult. As process nodes get smaller, relative device mismatch degrades due to lithographic and etching issues.

Several conventional approaches to average out mismatch exist. One of the best known methods is called "dynamic element matching," often applied to capacitor arrays by swapping mismatched devices at a moderate rate. This approach can be used to help reduce the effective mismatch somewhat, but does not eliminate it.

The disclosed concepts provide new and novel techniques for utilizing limit cycle phenomena and sigma-delta modulators to precisely calibrate an analog reference circuit or to provide one or more reference signals with high (or relatively high relative) precision. More specifically, the disclose concepts seek to provide superior, on-the-fly nullification of relative mismatch in a resistive ladder-type reference circuit that can be designed to have n bits of resolution.

As persons of ordinary skill in the art who have the benefit of the description of the disclosed concepts understand, the desired or appropriate reference resolution depends on the application. For example, a 14-bit Flash analog-to-digital converter (ADC) would require the reference's resolution to be about 15-16 bits. Manufacturing such a reference would be relatively difficult to accomplish.

Note that, as persons of ordinary skill in the art who have the benefit of the description of the disclosed concepts understand, the techniques and methodology according to the disclosed concepts is by no means limited to ADCs. Rather, one may apply the disclosed techniques to any other circuit that uses precision references (or references of relatively high precision or high relative precision).

Furthermore, the disclosed techniques can be used for other types of analog circuit calibration, as persons of ordinary skill in the art who have the benefit of the description of the disclosed concepts understand. For example, one may use reference signals provided by exemplary embodiments according to the disclosed concepts as relatively precise reference voltages, to a desired n bits of resolution, as reference signals for additional reference circuits.

Consider a fairly common technique to generate what by today's standards is an accurate current source. Typically, a simple voltage reference source is then derived (relatively poorly) from the current provided by the current source. Also, bandgap circuits can be used to provide a relatively stable voltage that, nevertheless, varies over process and temperature.

Conventional techniques exist for first-order cancellation of the temperature dependence of the bipolar device (typically, a bipolar junction transistor, or BJT) in the bandgap voltage circuits. For example, the state-of-the art today is to use a polysilicon resistor doped in a way such that it possesses a temperature coefficient that is opposite to that of the BJT's temperature coefficient in the bandgap circuit. The result is a relatively constant voltage over temperature that can be used to generate a voltage source that provides a voltage Vbandgap that is relatively immune to temperature (but in practice not perfect).

FIG. 1 illustrates a conventional reference circuit that uses a bandgap voltage source 13. The reference circuit in FIG. 1 is a commonly used method for generating relatively precise currents on-chip (i.e., within integrated circuit (IC) 10). It relies on an off-chip "precision" resistor that is generally selected with a tolerance of within ±1%. The unity-gain regulator 16 used will have a gain error that impose a voltage across the off-chip resistor that is approximately (but in practice not exactly) equal to the voltage Vbandgap.

The voltage Vbandgap then generates current, I, used for all other purposes, e.g., using a current source and a resistor ladder (with resistors Ra to Rz) to generate reference voltages Va-Vz. When all possible variations are accounted for, a total variation in the generated current will be in practice about 3-4%, depending on the design and process variations for a particular application or implementation.

Given that power supplies are generally regulated to a maximum of 5%, the benefits afforded by using a bandgap and related circuitry are not vastly better than simply deriving a voltage from the supply sources via a simple resistor divider or ladder that is placed between supply voltages Vdd and Vss.

Consider a precision voltage reference that is based on a poorly matched resistive ladder as shown in FIG. 1. The approximate current that drives the resistive ladder is denoted ~I, and will, according to Ohm's law, produce tap voltages Va, Vb, and so on, through Vz.

The errors in those voltages will primarily be due to the relative mismatch of each polysilicon (poly) resistor, Ra-Rz. In present complementary metal oxide semiconductor (CMOS) fabrication processes, the relative mismatches are up to about 1-2%. That fact alone limits the resolution of the flash ADC mentioned above to at most 8 bits of resolution (Flash ADCs generally derive their references in this manner, or in a similar way).

The above example makes apparent the difficulty of providing a high-resolution reference. If one rules out the use of expensive means, such as temperature-controlled, oven-based references or other off-chip means, the task becomes even more daunting.

Furthermore, if an improvement were made on-chip with conventional approaches, it would entail limiting the number of mismatch errors that accumulate through the process of generating the reference voltages and currents. For example, the current is based on bandgap voltage plus its error, op-amp or regulator gain error, external resistor tolerance, etc.

Figure 2:
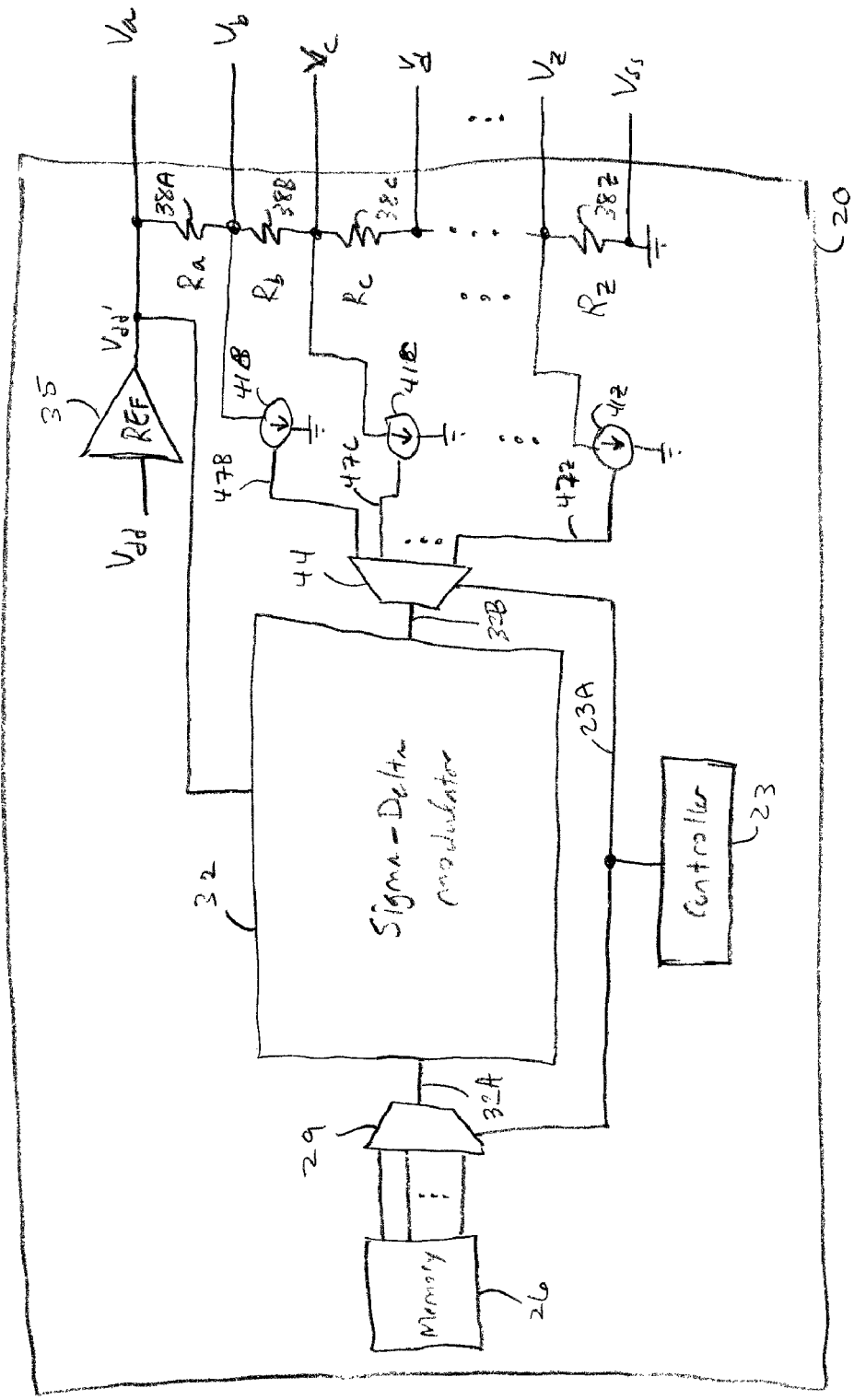
FIG. 2 depicts a reference circuit according to an exemplary embodiment.

One aspect of the disclosed concepts relates to using a resistor ladder together with corrective current sources that tap into each node of the resistive ladder. FIG. 2 a reference circuit or generator 20 according to an exemplary embodiment. Reference circuit 20 uses a resistor ladder together with current sources and a sigma-delta modulator in a feedback loop to correct errors in one or more reference signals.

Specifically, reference circuit 20 includes memory 26, controller 23, multiplexer (MUX) 29, sigma-delta modulator 32, demultiplexer (DeMUX) 44, voltage generator 35, a set of controlled current sources 41B-41Z, and a resistor ladder that includes resistors 38A-38Z (i.e., an arbitrary number, z, where z>1, of resistors in the resistor ladder).

The flow of current through the resistor ladder generates reference voltage Va-Vz. Each voltage that is generated across one of respective resistors 38A-38Z will include an error component or error signal or error voltage. The error voltage (generally, error signal or error component) arises because of relative resistor mismatch.

Each error voltage can be nullified out, or eliminated, or nearly or substantially eliminated or compensated for by a respective corrective current supplied by current sources 41B-41Z. More specifically, if one knows the magnitude of the error voltage, one may control or program each of current sources 41B-41Z to supply a corrective current (i.e., a zero current, thus neither injecting into, nor withdrawing current from, a tap; a finite current injected current into a tap; or a finite current withdrawn from a tap) to the respective taps in the resistor ladder (i.e., the ladder that includes resistors 38A-38Z).

Each of current sources 41B-41Z couples to a respective node in the resistor ladder. Thus, current source 41B couples to the node formed by coupling resistor 38A to resistor 38B. Similarly, current source 41C couples to the node formed by coupling resistor 38B to resistor 38C, and so on.

Sigma-delta modulator 32 controls current sources 41B-41Z so as to generate and apply the corrective currents to the taps in the resistor ladder. Sigma-delta modulator 32 produces a pulse-density modulated (PDM) digital output bit-stream that equals the average of its input signal.

Sigma-delta modulator 32 functions by sampling the input signal at frequencies several times that of the Nyquist rate. The input signal may be an analog or a digital signal.

As described in detail below, sigma-delta modulator 32 includes analog (or digital) integrators, a comparator, and a digital-to-analog converter (DAC). Sigma-delta modulator 32 is compatible with digital chip fabrication processes because the modulator itself is immune or relatively immune to the effects of mismatch.

The local supply, Vdd, is generated by voltage generator 35. Voltage generator 35 may constitute or include a buffer or regulator or filter. Voltage generator 35 drives both sigma-delta modulator 32 (as described in detail below), as well as the resistor ladder.

More specifically, voltage generator 35 provides the voltage Vdd' to the resistor ladder (i.e., to one terminal of resistor 38A). Note that the voltage Vdd' need not be derived from a precision reference. In other words, voltage generator 35 need not constitute a precision voltage generator. Rather, voltage generator 35 should generate voltage Vdd' to that is relatively stable and relatively low-noise. In exemplary embodiments, the absolute magnitude of voltage Vdd' may approach the supply voltage Vdd so as to maximize the dynamic range of reference circuits according to the disclosed concepts.

Memory 26 provides a set of z values for reference signals Va-Vz. By using negative feedback (described in detail below), reference circuit 20 corrects voltage Va-Vz such that the voltages match the reference signals provided by memory 26.

Controller 23 controls the operation of reference circuit 20, including the time-multiplexing of sigma-delta modulator 32. To provide reference signals efficiently, reference circuit 20 uses time multiplexing to use one instance of sigma-delta modulator 32 to provide an arbitrary number of reference signals, Va-Vz.

Specifically, controller 23 uses control signal 23A to control the operation of MUX 29 and De-MUX 44. Depending on the value of signal 23A, say, i, MUX 29 provides a respective reference value for reference voltage V1, and provides the reference value to sigma-delta modulator 32.

Sigma-delta modulator 32 generates control signal 47$i$ and provides that signal to De-MUX 44. Depending on the value of signal 23A, i.e., i, De-MUX 44 provides the output signal of sigma-delta modulator 32 to the respective current source 41$i$.

Figure 3:
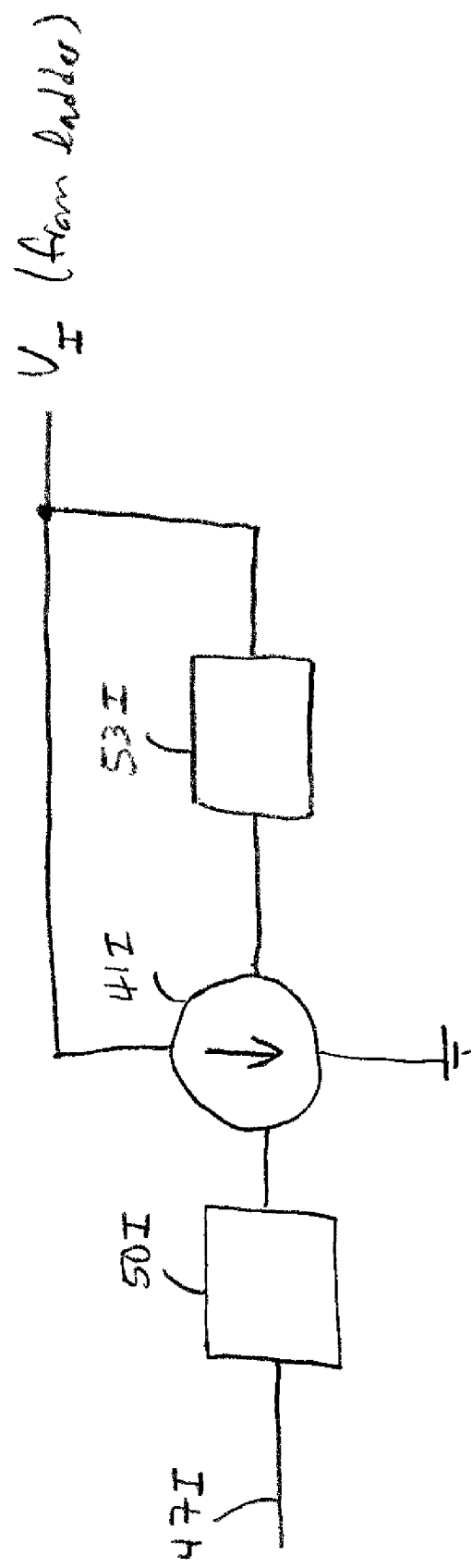
FIGS. 3-4 show simplified circuit arrangements for controlled current sources according to exemplary embodiments.
Figure 4:
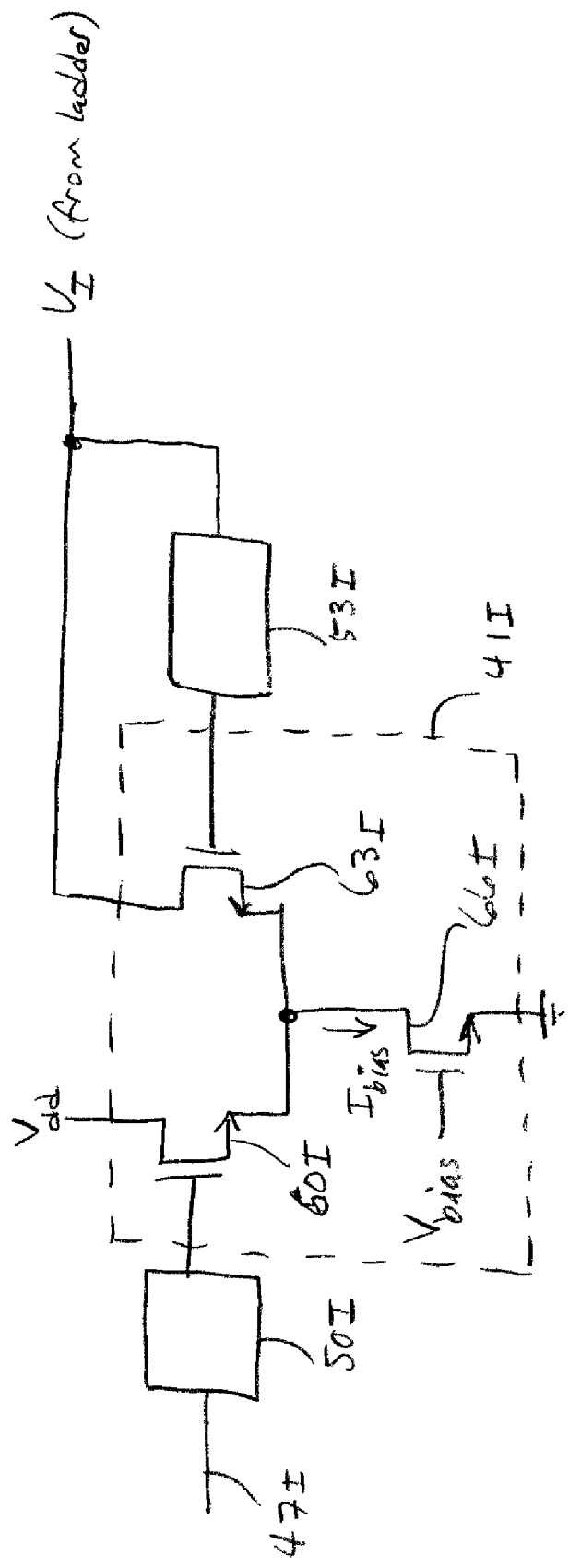

FIGS. 3-4 show simplified circuit arrangements for controlled current sources according to exemplary embodiments. The embodiment in FIG. 3 includes the current source for the i-th stage of the resistor ladder. The circuit arrangement includes filter 50I, current source 41I, and filter 53I.

Filters 50I and 53I constitute low-pass filters. Filter 50I accepts as an input signal 47I (e.g., from MUX 44 in FIG. 2). Filter 50I filters signal 47I, and provides the resulting filtered signal to current source 41I in order to control the current source.

Similarly, filter 53I accepts as an input signal one of the reference signals (e.g., from the resistor ladder in FIG. 2), in this case voltage $V_I$. Filter 53I filters signal $V_I$, and provides the resulting filtered signal to current source in order to control the current source.

One terminal of current source 41I couples to voltage $V_I$. The other terminal of current source 41I couples to the ground voltage, Vss.

Depending on the output signals of filter 50I and filter 53I, current source 41I may conduct a zero or finite current. In the case of a zero current, current source 41I neither injects current into, nor withdraws current from, the respective node of the resistor ladder that provides voltage $V_I$.

In the case of a finite current, current source 41I may either inject current into, or withdraw current from, the respective node of the resistor ladder that provides voltage $V_I$. More specifically, to increase the voltage of the respective node of the resistor ladder that provides voltage $V_I$, current source 41I injects current into the respective node. Conversely, to reduce the voltage, current source 41I withdraws current from the respective node (i.e., sinks current from the node to ground).

Similarly, the embodiment in FIG. 4 includes the current source for the i-th stage of the resistor ladder. The circuit arrangement includes filter 50I, filter 53I, transistor 60I, transistor 63I, and transistor 66I.

Transistors 60I and 63I form a differential amplifier. Transistor 66I provides a bias current for the differential amplifier. More specifically, transistor 66I conducts a current in response to a bias signal, Vbias. In response to the difference in the voltages applied to their respective gate terminals, transistors 60I and 63I conduct currents whose sum is the current conducted by transistor 66I.

Filters 50I and 53I constitute low-pass filters. Filter 50I accepts as an input signal 47I (e.g., from MUX 44 in FIG. 2). Filter 50I filters signal 47I, and provides the resulting filtered signal to transistor 60I.

Similarly, filter 53I accepts as an input signal one of the reference signals (e.g., from the resistor ladder in FIG. 2), in this case voltage $V_I$. Filter 53I filters signal $V_I$, and provides the resulting filtered signal to transistor 63I.

As noted, transistor 60I and transistor 63I form a differential pair or differential amplifier. Depending on the output signals of filter 50I and filter 53I, the differential amplifier may conduct a zero current, or a finite current in order to inject current into, or withdraw current from, the respective node of the resistor ladder that provides voltage $V_I$.

Figure 5:
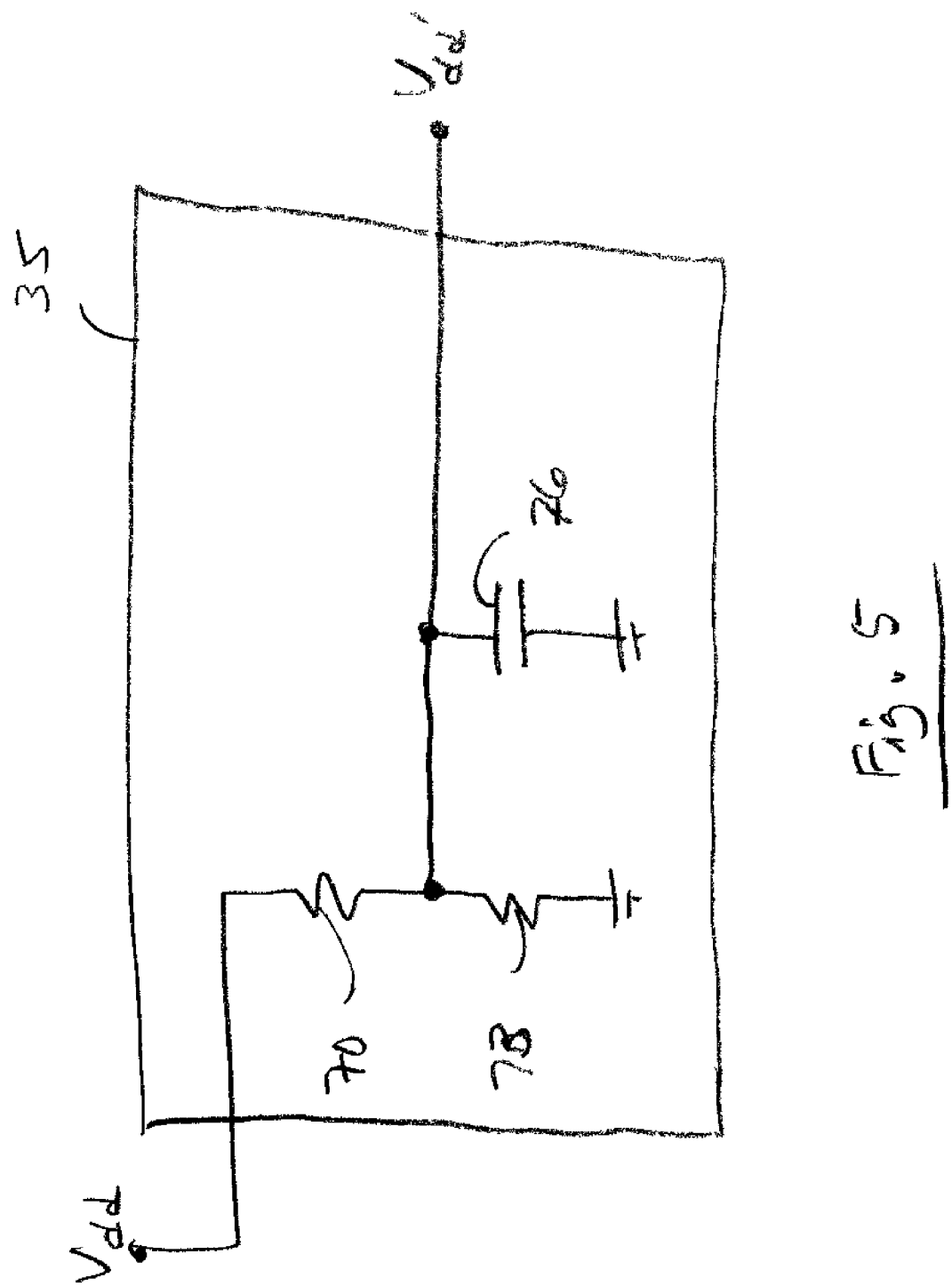
FIGS. 5-7 illustrate simplified circuit arrangements for voltage sources according to exemplary embodiments.
Figure 6:
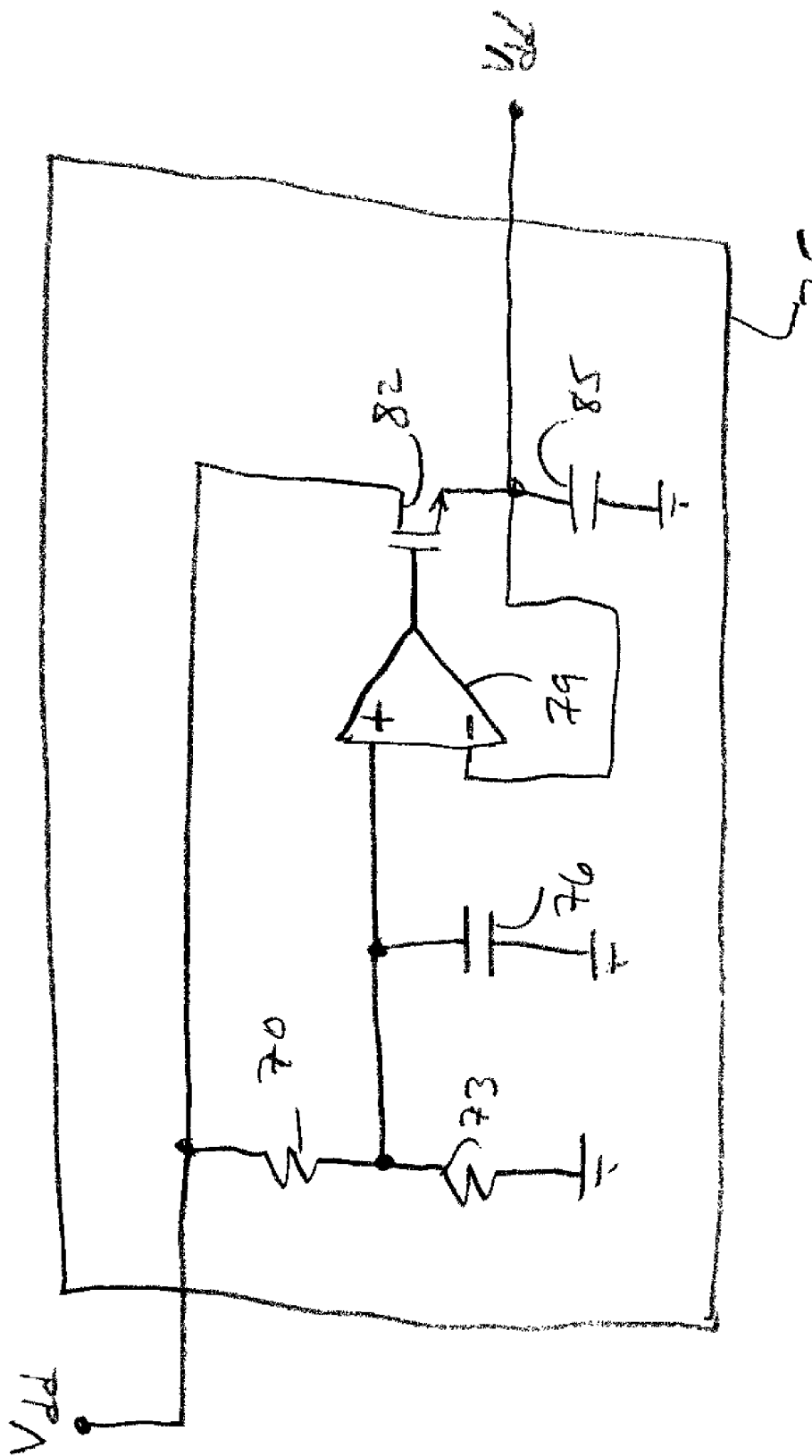
Figure 7:
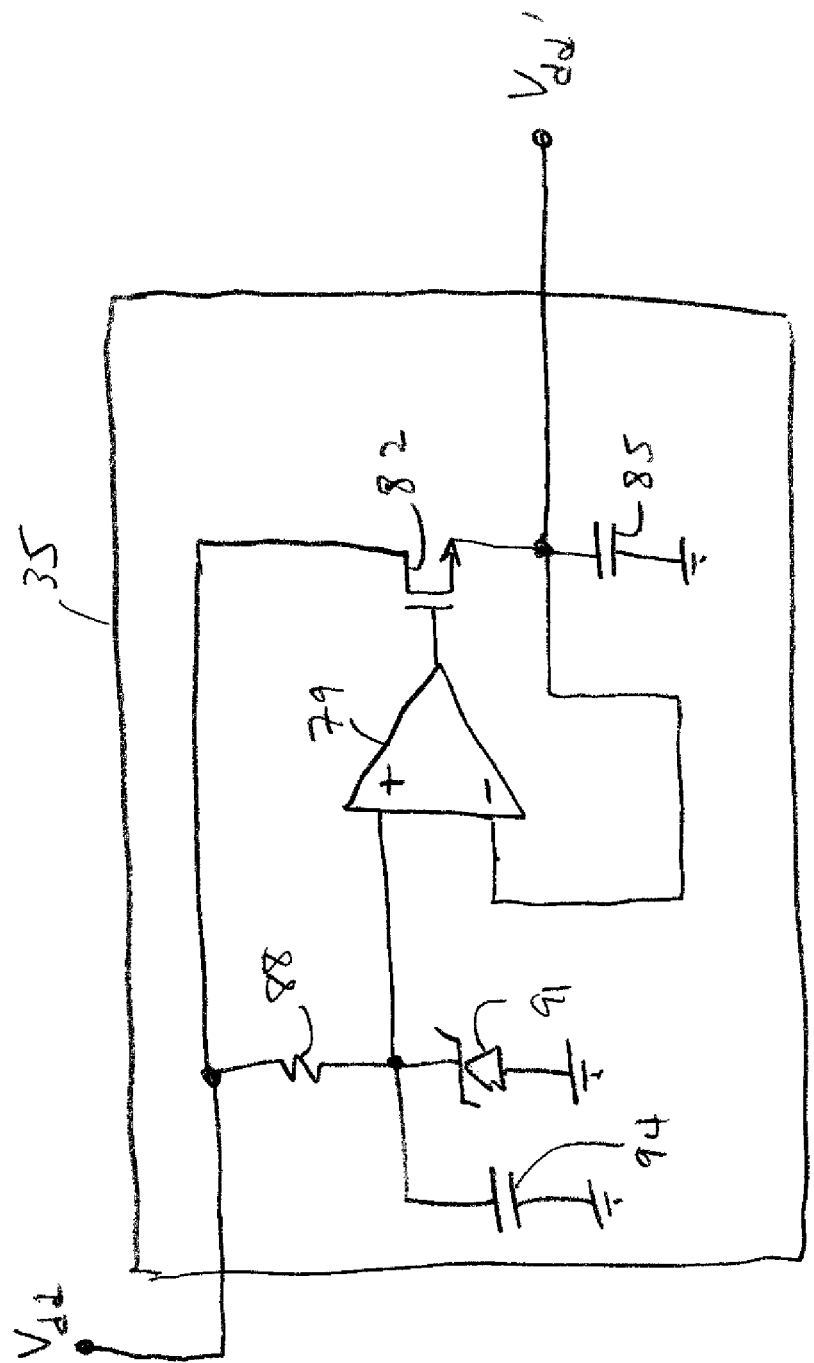

FIGS. 5-7 illustrate simplified circuit arrangements for voltage source 35 (see FIG. 2) according to exemplary embodiments. Referring to FIG. 5, voltage source 35 includes a voltage divider and a filter capacitor.

Specifically, resistor 70 and resistor 73 form a voltage divider. The voltage divider divides the supply voltage, Vdd, and provides the output voltage of voltage generator 35, Vdd'.

Capacitor 76 provides noise filtering. In addition, capacitor 76 may provide decoupling for Vdd'.

The embodiment in FIG. 6 includes a voltage divider, a feedback amplifier, and filter capacitors. Specifically, resistor 70 and resistor 73 form a voltage divider. The voltage divider divides the supply voltage, Vdd, and provides as its output Vdd'. Capacitor 76 provides noise filtering and decoupling for voltage Vdd'.

Amplifier 70 and transistor 82 form a feedback circuit. The drain terminal of transistor 82 couples to the supply voltage, Vdd. The source terminal of transistor 82 couples to amplifier 70. The output of amplifier 70 drives the gate terminal of transistor 82.

Through the use of negative feedback, transistor 82 conducts so as to make the voltage at its source terminal approximately equal to the output voltage of the voltage divider, i.e., Vdd'.

Capacitor 85 provides noise filtering. In addition, capacitor 85 may provide decoupling for Vdd'.

The embodiment in FIG. 7 includes Zener diode 91, bias resistor 88, a feedback amplifier, and filter capacitors. Specifically, resistor 88 biases Zener diode 91. Zener diode 91 provides voltage Vdd'. to amplifier 70. Capacitor 94 provides noise filtering and decoupling for Zener diode 91.

Amplifier 70 and transistor 82 form a feedback circuit. The drain terminal of transistor 82 couples to the supply voltage, Vdd. The source terminal of transistor 82 couples to amplifier 70. The output of amplifier 70 drives the gate terminal of transistor 82.

Through the use of negative feedback, transistor 82 conducts so as to make the voltage at its source terminal approximately equal to the voltage across Zener diode 91, i.e., Vdd'.

Capacitor 85 provides noise filtering. In addition, capacitor 85 may provide decoupling for Vdd'.

In the embodiments shown in FIGS. 5-7, voltage Vdd' has a smaller value than the supply voltage, Vdd. Note, however, that one may generate voltage Vdd' such that it has the same (or nearly or substantially the same) value as the supply voltage, Vdd, by making modifications that fall within the knowledge of persons of ordinary skill in the art who have the benefit of the description of the disclosed concepts. For example, one may omit the voltage dividers, use an amplifier stage to scale the output voltage of the voltage divider or of transistor 82 (to make it equal to, or nearly or substantially equal to, the supply voltage), etc.

Note that in the circuits in FIGS. 6 and 7, the load on the Vdd' voltage is not merely capacitive. Rather, there would be current draw on the Vdd' source in the context of the larger system.

Figure 8:
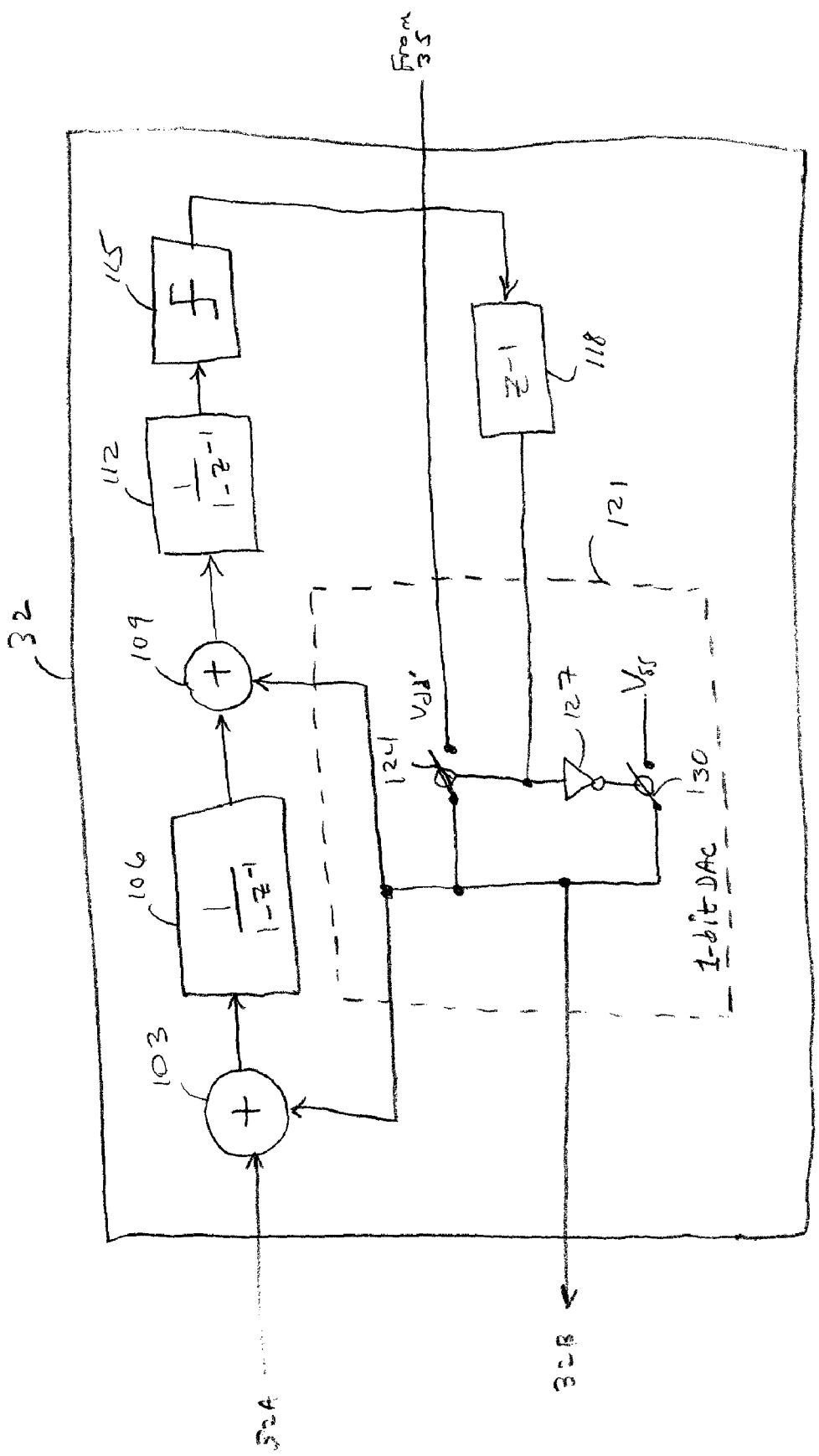
FIG. 8 shows a simplified block diagram of a sigma-delta modulator according to an exemplary embodiment.

FIG. 8 shows a simplified block diagram of a sigma-delta modulator 32 according to an exemplary embodiment. Sigma-delta modulator 32 includes adders 103 and 109, integrators 106 and 112, comparator 115, delay circuit 118, and DAC 12I.

Input signal 32A couples to one input of adder 103. The output signal of DAC 12I couples to another input of adder 103. The output of adder 103 couples to the input of integrator 106.

The output of integrator 106 couples to one input of adder 109. The output signal of DAC 12I couples to another input of adder 109. The output of adder 109 couples to the input of integrator 112.

The output of integrator 112 couples to one input of comparator 115. Comparator 115 comparators the output signal of integrator 112 to a reference signal (e.g., ground voltage), and provides the resulting signal to the input of delay circuit 118.

The output of delay circuit 118 couples to the input of DAC 12I. The output of DAC 12I constitutes the output signal 32B of sigma-delta modulator 32.

DAC 12I constitutes a one-bit DAC. DAC 12I includes a pair of controlled switches 124 and 130 (e.g., transmission gates). The output of delay circuit 118 controls switch 124. Under the control of the output signal of delay circuit 118, switch 124 couples voltage Vdd' (from voltage generator 35, see FIG. 2) to adders 103 and 109, as well as the output of sigma-delta modulator 32.

The output of delay circuit 118 couples to inverter 127. Inverter 127 logically inverts the output signal of delay circuit 118, and uses the resulting signal to control switch 130. Thus, under the control of the output signal of inverter 127, switch 130 couples the ground voltage Vss to adders 103 and 109, as well as the output of sigma-delta modulator 32.

Note that one may implement DAC 12I in other ways, as persons of ordinary skill in the art who have the benefit of the description of the disclosed concepts understand. Furthermore, although the embodiment in FIG. 8 shows a second-order sigma-delta modulator, one may use other types of sigma-delta modulator, as desired, and as persons of ordinary skill in the art who have the benefit of the description of the disclosed concepts understand.

Regardless of the order of the modulator, one should design it to have sufficient dynamic range and, hence, resolution. Note that, although one may use a single-order modulator, doing so may result in less dynamic range. Specifically, single-order sigma-delta modulators exhibit poorer dynamic range because of higher levels of quantization noise they tend to exhibit tones, as a result of insufficient limit cycle randomization. Furthermore, note that, although sigma-delta modulator 32 uses unity-gain feed-forward and feedback coefficients, one may use other values (i.e., values other than unity gain), as persons of ordinary skill in the art who have the benefit of the description of the disclosed concepts understand.

Second-order or higher-order sigma-delta modulators tend not suffer from those tones. As a result, they provide better dynamic range than do single-order modulators.

Assuming a second-order modulator, the equation below provides the in-band quantization noise:

$$n_o = \frac{\Delta}{\sqrt{12}} \cdot \frac{\pi^2}{\sqrt{5}} \cdot \left(\frac{2f_o}{f_s}\right)^{\frac{5}{2}},$$

where fo and fs constitute, respectively, the baseband range and the sampling frequencies, and Δ denotes the quantization level.

The above equation shows that the power spectral density is noise-shaped according to the order of the modulator, the sampling frequency, and the baseband range (i.e., bandwidth). Note that the baseband range (fo) may be relatively low in frequency for the particular application here (i.e., sigma-delta modulators used in reference circuits). Consequently, it is possible to attain relatively high resolution.

Note that the full-scale reference level of the modulator is the same as the quantization level, i.e., Δ. More specifically, the resistor ladder's supply (see FIG. 2), Vdd, has the same voltage as the quantization level, Δ, and the full-scale reference level of the sigma-delta modulator.

The PDM output of the modulator is based on the full-scale reference level. Put another way, the input to the sigma-delta modulator is modulated to the output as a PDM digital bit-stream whose pattern is related to the full-scale reference level. The average PDM output of the sigma-delta modulator simply represents the average input signal.

Note that the voltage Vdd' is common to the reference ladder's most significant bit (MSB) tap, and the sigma-delta modulator's DAC (MSB effective voltage). This arrangement allows maintaining high relative precision in the output signals of the reference circuit.

For example, if Vdd' equals 1.2V, then (assuming an analog input) an input at 1.2V (full-scale) will have a continuous PDM output of digital "1"s (i.e., "11111 ..."). Similarly, a 0V input signal will produce an output of digital "0"s (i.e., "00000 ..."). A second-order PDM output signal at 0.6V (or half-scale, the example described here) will produce a PDM output of alternating double ones and double zeros, i.e., "00110011 ...."

Note that the PDM output is operating at the sampling frequency, fs. As such, it is highly oversampled relative to the baseband range or, in this case, a DC signal.

As noted above, the input to sigma-delta modulator 32 constitutes a digital n-bit representation of the ideal or desired analog voltages at the respective tap of the resistor ladder (e.g., Va, Vb, etc.). Through the use of feedback and time multiplexing, sigma-delta modulator 32 generates control signals that ultimately cause the generation of the corrective currents for each of the output reference signals or voltages, e.g., voltages Va through Vz, by the controlled current sources (see FIGS. 2, 9).

Figure 9:
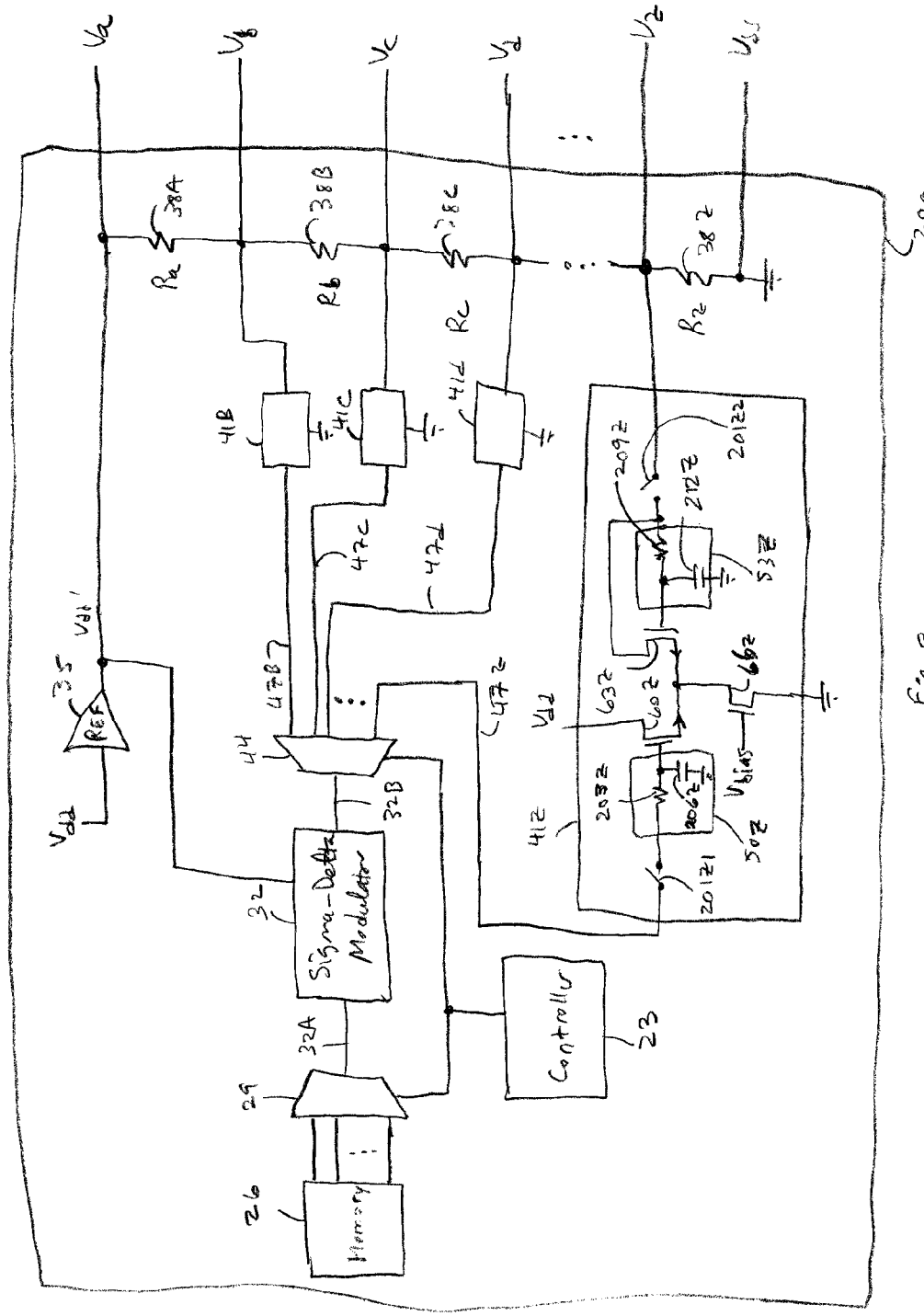
FIG. 9 illustrates a reference circuit according to another exemplary embodiment.

FIG. 9 illustrates a reference circuit or generator 200 according to another exemplary embodiment. Reference circuit 200 includes similar components or blocks and topology as reference circuit 20 (see FIG. 2).

Specifically, reference circuit 20 includes memory 26, controller 23, multiplexer (MUX) 29, sigma-delta modulator 32, demultiplexer (DeMUX) 44, voltage generator 35, a set of controlled current sources 41B-41Z, and a resistor ladder that includes resistors 38A-38Z (i.e., an arbitrary number, z, where z>1, of resistors in the resistor ladder).

Similar to reference circuit 20, reference circuit 200 uses a resistor ladder together with current sources to correct errors. Thus, the flow of current through the resistor ladder generates reference voltage Va-Vz. Current sources 41B-41Z correct or nullify or eliminate (or nearly or substantially correct or nullify or eliminate) the error components across one of respective resistors 38A-38Z.

Each of current sources 41B-41Z includes the more detailed circuitry shown for one of the current sources (for the sake of clarity of presentation), current source 41Z. Current source 41Z includes switches 201Z1 and 201Z2, filters 50Z and 53Z, and transistors 60Z, 63Z, and 66Z.

Similar to the embodiment shown in FIG. 4, transistors 60Z and 63Z form a differential amplifier. Transistor 66Z provides a bias current for the differential amplifier. More specifically, transistor 66Z conducts a current in response to a bias signal, Vbias. In response to the difference in the voltages applied to their respective gate terminals, transistors 60Z and 63Z conduct currents whose sum is the current conducted by transistor 66Z.

Filters 50Z and 53Z constitute low-pass resistor-capacitor (RC) filters. Thus, filter 50Z includes resistor 203Z and capacitor 206Z. Similarly, filter 53Z includes resistor 209Z and capacitor 212Z.

Filter 50Z accepts as an input signal 47Z from MUX 44. Filter 50Z filters signal 47Z, and provides the resulting filtered signal to transistor 60Z.

Similarly, filter 53Z accepts as an input signal reference signal Vz. Filter 53Z filters signal $V_Z$, and provides the resulting filtered signal to transistor 63Z.

Controller 23 controls switches 201Z1 and 201Z2 (control mechanism or signals not shown explicitly). Assume switches 201Z1 and 201Z2 are closed. Adjusting current flow through resistor 38Z will correct the voltage across it (Vz), thus leading to precision. The correction is accomplished by using sigma-delta modulator 32 to accept an n-bit digital word for reference signal Vz that represents a quantized level based on the full-scale value of sigma-delta modulator 32.

The output of sigma-delta modulator 32 will then produce a PDM bit-stream that is based on the quantization level, Δ, which equals Vdd'. The negative-feedback loop with the current-correcting differential pair (i.e., transistors 60Z and 63Z) will adjust the output current of current source 41Z so that the voltage Vz matches the n-bit precision word seen at the output of sigma-delta.

Note that embodiment 200 uses differential circuit so that both inputs have a sampling switch (i.e., switches 201Z1 and 201Z2). In this way, when switches 201Z1 and 201Z2 open simultaneously on the respective input circuits of the differential pair, charge feed-through and dumping will cancel out, as this component will exhibit at the output as a common-mode signal. By its nature, the differential pair suppresses that common-mode signal.

The baseband frequency, fo, is set by the RC time constants at the inputs to the differential pair, i.e., by filters 50Z and 53Z. Filters 50Z and 53Z also serve to provide the average signal to the input of the differential pair. Capacitor 206Z and capacitor 212Z should have large enough capacitance values so as to hold the average signal value after switches 201Z1 and 201Z2 are opened, thus biasing the differential pair to pull sufficient current from the resistor ladder at resistor 38Z, and hence tuning the voltage at the tap node (Vz) to the precise desired value, with n bits of resolution.

As noted, reference circuit 200 uses time-multiplexing to correct all of the tap voltages (i.e., voltages Va-Vz) in a round-robin fashion. Reference circuit 200 thus cycles continuously to correct and adjust for temperature and other drifts that may occur. During each cycle, all voltages are tuned starting from the top of the reference resistor ladder to the bottom (i.e., voltages Va-Vz).

Figure 10:
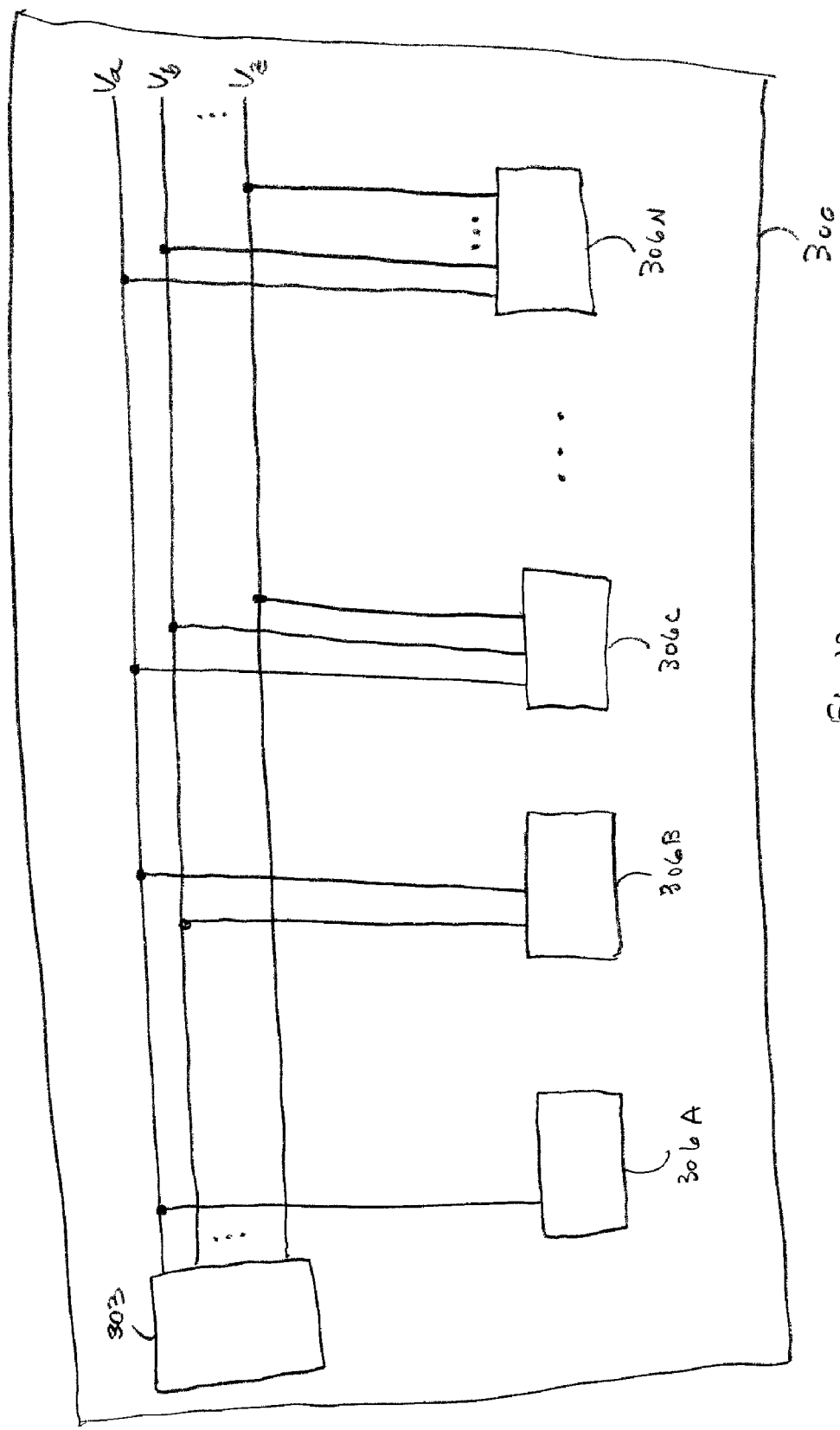
FIG. 10 depicts a circuit arrangement, according to an exemplary embodiment, for providing reference signals to circuitry in an IC.

One may apply the disclosed concepts to a variety of electronic circuits, for example, ICs. FIG. 10 shows a circuit arrangement, according to an exemplary embodiment, for providing reference signals to circuitry in an IC 300.

IC 300 includes reference circuit 303. In addition, IC 300 includes a plurality of N (where N≧1) circuits or blocks 306A-306N.

Reference circuit 303 may constitute a reference circuit according to the disclosed concepts. For example, reference circuit 303 may constitute reference circuit 20 in FIG. 2 or reference circuit 200 in FIG. 9.

Circuits or blocks 306A-306N may constitute a wide range of circuitry. Generally speaking, circuits or blocks 306A-306N use one or more reference signals.

Reference circuit 303 generates a set of reference signals. In the embodiment shown in FIG. 10, reference circuit 303 generates reference voltages Va-Vz.

Each of circuits or blocks 306A-306N may use one or more of the reference signals, e.g., one or more of reference voltages Va-Vz. For example, in the example shown in FIG. 10, circuit or block 306A uses reference voltage Va.

Similarly, circuit or block 306B uses reference voltages Va, and Vb, whereas circuit or block 306C uses reference voltages Va, Vb, and Vz. As another example, circuit or block 306N uses all of reference voltages Va-Vz.

As persons of ordinary skill in the art who have the benefit of the description of the disclosed concepts understand, other combinations of circuit or blocks and reference voltages is possible. As examples, one may use more than one reference circuit, or one may use other combinations of reference signals for a given block or circuit, as desired.

Figure 11:
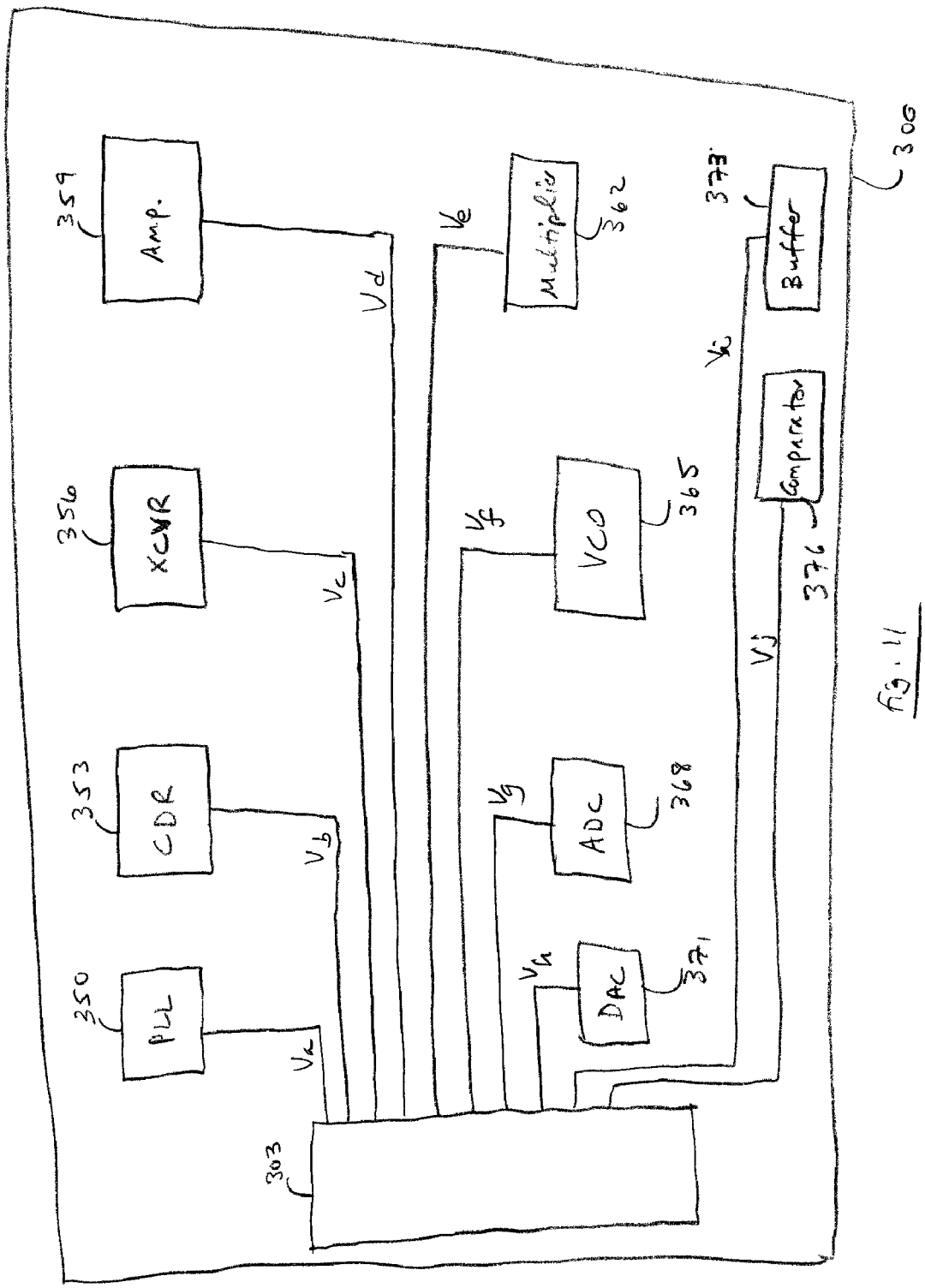
FIG. 11 shows a circuit arrangement, according to another exemplary embodiment, for providing reference signals to circuitry within an IC.

FIG. 11 shows a circuit arrangement, according to another exemplary embodiment, for providing reference signals to circuitry within an IC 300. IC 300 includes reference circuit 303. In addition, IC 300 may include one or more of PLL 350, CDR 353, transceiver (XCVR) 356, amplifier 359, multiplier 362, VCO 365, ADC 368, DAC 371, buffer 373, and comparator 376.

Reference circuit 303 may constitute a reference circuit according to the disclosed concepts. For example, reference circuit 303 may constitute reference circuit 20 in FIG. 2 or reference circuit 200 in FIG. 9.

Reference circuit provides at least one reference signal (e.g., a voltage signal) to each of the circuits 350-376. Thus, in the embodiment shown, reference circuit 303 provides reference voltage Va to PLL 350, reference voltage Vb to CDR 353, and so on, to reference voltage Vj, which it provides to comparator 376.

Note that IC 300 may include other arrangements of circuitry, as persons of ordinary skill in the art who have the benefit of the description of the disclosed concepts understand. For example, other than reference circuit 300, IC 300 may or may not include all of the circuitry shown.

As another example, IC 300 may include more than one instance of each of the circuits shown (including reference circuit 300). Thus, one may use more than one reference circuit, or one may use other combinations of reference circuits, reference signals, and/or circuits or blocks, as desired.

Figure 12:
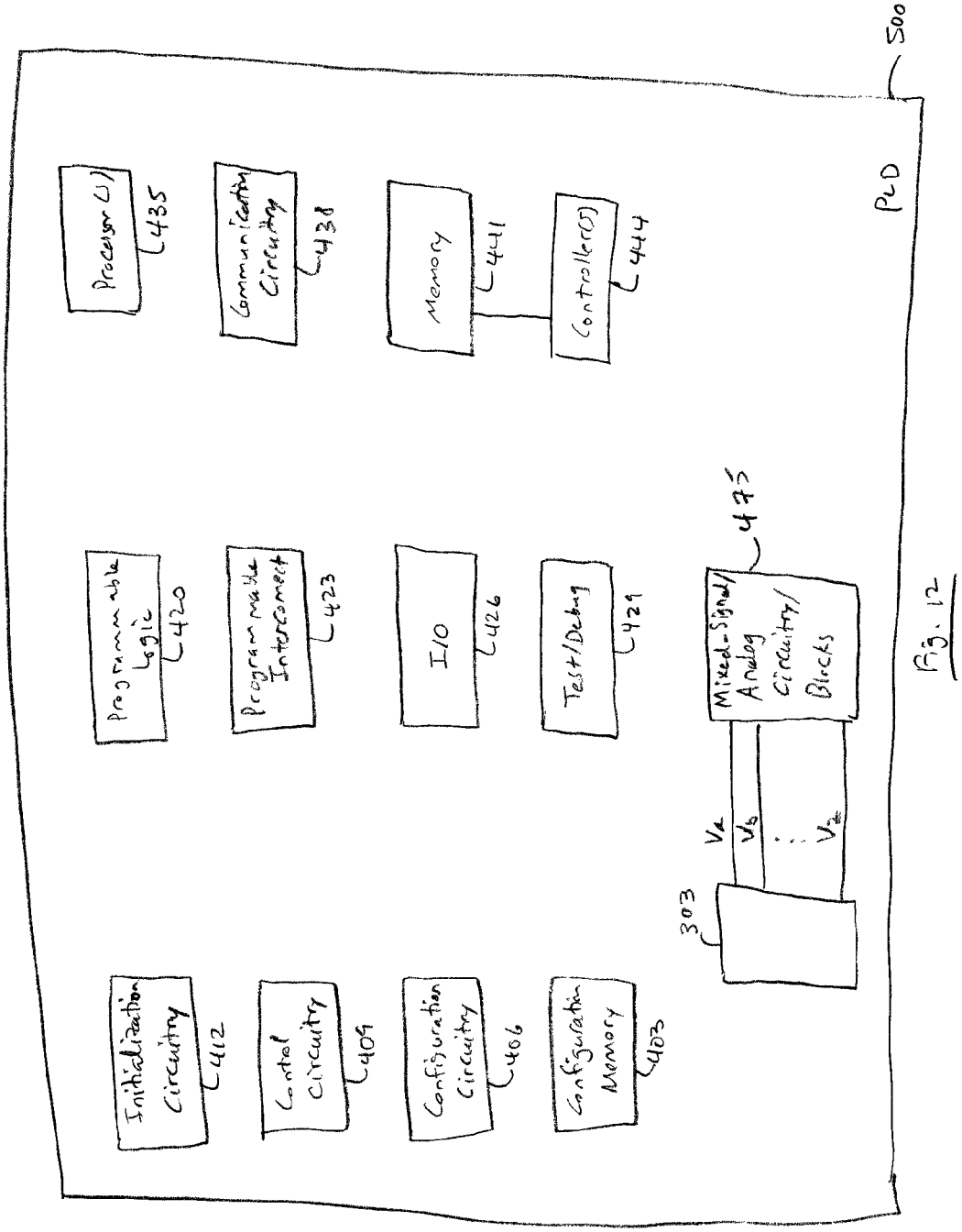
FIG. 12 illustrates a circuit arrangement, according to an exemplary embodiment, for providing reference signals to circuitry in a programmable logic device (PLD).

As noted, one may apply the disclosed concepts to a variety of ICs, including programmable logic devices (PLDs). FIG. 12 illustrates a circuit arrangement, according to an exemplary embodiment, for providing reference signals to circuitry in a PLD 500.

PLD 500 includes configuration circuitry 406, configuration memory (CRAM) 403, control circuitry 409, programmable logic 420, programmable interconnect 423, and I/O circuitry 426.

In addition, PLD 500 may include test/debug circuitry 429, one or more processors 435, one or more communication circuitry 438, one or more memories 441, one or more controllers 444, and initialization circuit 412, as desired.

Note that the figure shows a simplified block diagram of PLD 500. Thus, PLD 500 may include other blocks and circuitry, as persons of ordinary skill in the art understand. Examples of such circuitry include signal and/or clock generation and distribution circuits, redundancy circuits, and the like.

Programmable logic 420 includes blocks of configurable or programmable logic circuitry, such as look-up tables (LUTs), product-term logic, multiplexers (MUXs), logic gates, registers, memory, and the like. Programmable interconnect 423 couples to programmable logic 420 and provides configurable interconnects (coupling mechanisms) between various blocks within programmable logic 420 and other circuitry within or outside PLD 500.

Control circuitry 409 controls various operations within PLD 500. Under the supervision of control circuitry 409, PLD configuration circuitry 406 uses configuration data (which it obtains from an external source, such as a storage device, a host, etc.) to program or configure the functionality of PLD 500. Configuration data are typically stored in CRAM 403. The contents of CRAM 403 determine the functionality of various blocks of PLD 500, such as programmable logic 420 and programmable interconnect 423. Initialization circuit 412 may cause the performance of various functions at reset or power-up of PLD 500.

I/O circuitry 426 may constitute a wide variety of I/O devices or circuits, as persons of ordinary skill in the art who have the benefit of the disclosure understand. I/O circuitry 426 may couple to various parts of PLD 500, for example, programmable logic 420 and programmable interconnect 423. I/O circuitry 426 provides a mechanism and circuitry for various blocks within PLD 500 to communicate with external circuitry or devices.

Test/debug circuitry 429 facilitates the testing and troubleshooting of various blocks and circuits within PLD 500. Test/debug circuitry 429 may include a variety of blocks or circuits known to persons of ordinary skill in the art who have the benefit of the disclosure. For example, test/debug circuitry 429 may include circuits for performing tests after PLD 500 powers up or resets, as desired. Test/debug circuitry 429 may also include coding and parity circuits, as desired.

PLD 500 may include one or more processors 435. Processor 435 may couple to other blocks and circuits within PLD 500. Processor 435 may receive data and information from circuits within or external to PLD 500 and process the information in a wide variety of ways, as persons skilled in the art with the benefit of the disclosure in this document appreciate. One or more of processor(s) 435 may constitute a digital signal processor (DSP). DSPs allow performing a wide variety of signal processing tasks, such as compression, decompression, audio processing, video processing, filtering, and the like, as desired.

PLD 500 may also include one or more communication circuits 438. Communication circuit(s) 438 may facilitate data and information exchange between various circuits within PLD 500 and circuits external to PLD 500, as persons of ordinary skill in the art who have the benefit of the disclosure in this document understand.

PLD 500 may further include one or more memories 441 and one or more controller(s) 444. Memory 441 allows the storage of various data and information (such as user-data, intermediate results, calculation results, etc.) within PLD 500. Memory 441 may have a granular or block form, as desired. Controller 444 allows interfacing to, and controlling the operation and various functions of circuitry outside the PLD. For example, controller 444 may constitute a memory controller that interfaces to and controls an external synchronous dynamic random access memory (SDRAM), as desired.

Generally speaking, PLD 500 may include one or more reference circuits 303. Each reference circuit 303 may constitute a reference circuit according to the disclosed concepts. For example, each reference circuit 303 may constitute reference circuit 20 in FIG. 2 or reference circuit 200 in FIG. 9.

In the embodiment shown, PLD 500 includes one reference circuit 303. Reference circuit 303 provides a set of reference signals (shown as reference voltages Va-Vz in the embodiment of FIG. 12) to mixed-signal/analog circuits/blocks 475. Circuits/blocks 475 may include various analog circuitry and/or mixed-signal circuitry, as desired. Examples include PLLs, CDRs, transceivers (might constitute part of communication circuitry 438), amplifiers, multipliers, VCOs, ADCs, DACs, buffers, and comparators.

In addition, reference circuit 303 may provide one or more reference signals to other circuits in PLD 500, including some digital circuits. For example, some memory circuits may use reference signals. As another example, some level-shifter or logic circuits may use reference signals.

Note that the foregoing blocks and circuits constitute merely illustrative examples. As persons of ordinary skill in the art who have the benefit of the description of the disclosed concepts understand, one may apply the disclosed concepts to other circuitry and blocks in PLD 500.

Furthermore, as persons of ordinary skill in the art who have the benefit of the description of the disclosed concepts understand, other combinations of circuit or blocks and reference voltages is possible. As examples, one may use more than one reference circuit, or one may use other combinations of reference signals for a given block or circuit, as desired.

Figure 13:
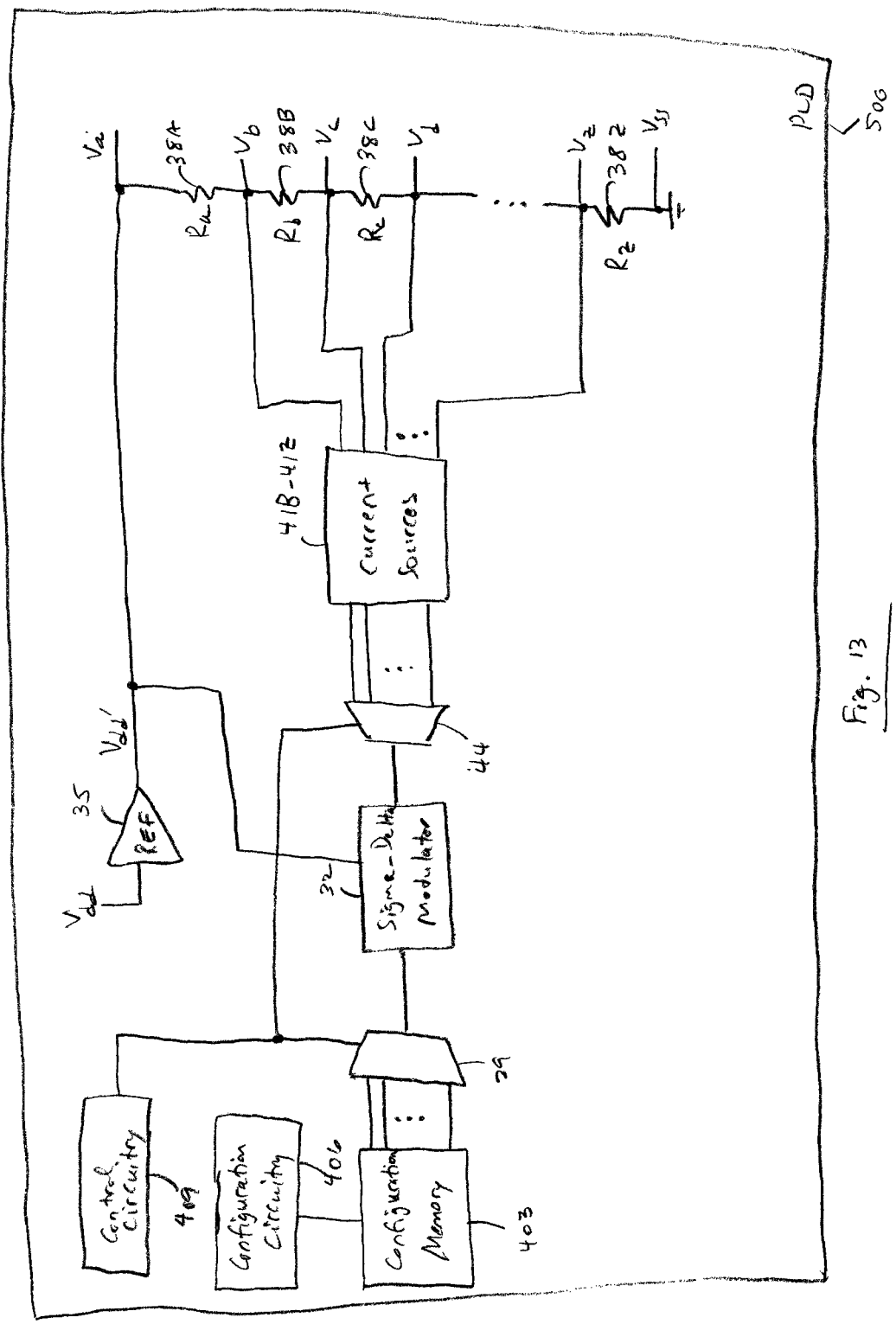
FIG. 13 a circuit arrangement, according to another exemplary embodiment, for providing reference signals to circuitry in a PLD.

FIG. 13 a circuit arrangement, according to another exemplary embodiment, for providing reference signals to circuitry in a PLD 500. The circuit arrangement in FIG. 13 includes some of the blocks and circuits from the reference circuits shown in FIGS. 2, 9, or both. Those blocks and circuits operate in a similar fashion as that described above.

Rather than using memory 26 and/or controller 23, however, the embodiment shown in FIG. 13 takes advantages of circuitry available in PLD 500. Thus, the embodiment in FIG. 13 may use control circuitry 409, configuration circuitry 406, and/or configuration memory 403.

Specifically, control 409 may control the operation of the reference circuit, described above, in addition to controlling the operation of other parts of PLD 500. Furthermore, configuration memory 403 may obtain configuration values for the reference circuit through or from configuration circuitry 406, along with configuration data for PLD 500.

Configuration memory 403 may store the configuration values for the reference circuit. Thus, under control of control circuitry 409, configuration memory 403 provides the configuration values to MUX 29.

In this manner, one may provide a mechanism for user-programmable reference signals. In other words, as part of programming the functionality of PLD 500, the user may provide desired or programmed reference values to configuration memory 403, as part of the overall configuration data for PLD 500. During operation, the reference circuit may obtain the reference values from configuration memory 403, and provide those values to sigma-delta modulator 32 via MUX 29.

Sigma-delta modulator 32 may use the values in the manner described above to generate a set of reference signals (e.g., reference voltages Va-Vz). Various circuitry and circuit blocks (for example, as described above in connection with FIG. 12) in PLD 500 may use one or more reference signals, as desired.

As persons of ordinary skill in the art who have the benefit of the description of the disclosed concepts understand, other combinations of circuit or blocks and reference signals is possible. As examples, one may use more than one reference circuit, or one may use other combinations of reference signals for a given block or circuit, as desired. As yet another example, one may use configuration circuitry 406 and configuration memory 403, together with controller 23 (see, for example, FIGS. 2 and 9), rather than using control circuitry 409 of PLD 500.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An integrated circuit (IC), comprising:
    a reference circuit, comprising:
        at least one controlled current source;
        a sigma-delta modulator coupled to the at least one controlled current source;
        a resistor ladder; and
        a voltage generator that supplies a voltage to the sigma-delta modulator, and to the resistor ladder.

2. The integrated circuit (IC) according to claim 1, wherein the voltage is used in a digital-to-analog converter (DAC) in the sigma-delta modulator.

3. The integrated circuit (IC) according to claim 2, wherein the voltage supplied to the resistor ladder generates at least one reference voltage.

4. The integrated circuit (IC) according to claim 1, wherein the at least one controlled current source includes a pair of switches coupled to a respective pair of filters.

5. The integrated circuit (IC) according to claim 4, wherein the at least one controlled current source further includes a differential pair coupled to the pair of filters.

6. The integrated circuit (IC) according to claim 1, wherein the at least one controlled current source provides a corrective current for at least one reference signal.

7. The integrated circuit (IC) according to claim 6, further comprising analog or mixed-signal circuitry, wherein the at least one reference signal is supplied to the analog or mixed-signal circuitry.

8. The integrated circuit (IC) according to claim 7, further comprising programmable logic circuitry.

9. The integrated circuit (IC) according to claim 8, further comprising programmable interconnect circuitry.

10. The integrated circuit (IC) according to claim 1, wherein the sigma-delta modulator comprises a second-order sigma-delta modulator.

11. An apparatus, comprising:
    a sigma-delta modulator used in a feedback loop to correct at least one error component corresponding to at least one reference signal;
    wherein the feedback loop further comprises at least one controlled current source, comprising a differential pair, coupled to the sigma-delta modulator.

12. The apparatus according to claim 11, wherein the at least one reference signal is provided to a circuit.

13. The apparatus according to claim 12, wherein the circuit comprises analog circuitry.

14. The apparatus according to claim 12, wherein the circuit comprises mixed-signal circuitry.

15. The apparatus according to claim 11, wherein the at least one controlled current source causes the correction of the at least one error component.

16. The apparatus according to claim 15, wherein the at least one controlled current source provides a corrective current to the at least one reference signal.

17. The apparatus according to claim 11, wherein the at least one controlled current source further comprises a pair of filters coupled to the differential pair.

18. The apparatus according to claim 11, wherein the sigma-delta modulator is operated in a time-multiplexed manner.

19. The apparatus according to claim 11, wherein the at least one reference signal is generated by a resistor ladder.

20. The apparatus according to claim 19, further comprising a voltage generator that derives a voltage from a supply voltage, wherein the voltage is provided to the sigma-delta modulator, and wherein the voltage is supplied to the resistor ladder.

21. The apparatus according to claim 11, wherein the sigma-delta modulator comprises a second-order sigma-delta modulator.

22. A method of generating at least one reference signal, the method comprising:
    using a sigma-delta modulator in a feedback loop to generate at least one correction signal corresponding to the at least one reference signal; and
    using the at least one correction signal to generate the at least one reference signal,
    wherein using the sigma-delta modulator in the feedback loop comprises operating the sigma-delta modulator in a time-multiplexed manner.

23. The method according to claim 22, wherein the at least one reference signal comprises a high relative precision signal.

24. The method according to claim 22, further comprising using the at least one reference signal to generate a set of additional reference signals.

25. The method according to claim 22, further comprising supplying the at least one reference signal to an analog circuit.

26. The method according to claim 22, further comprising supplying the at least one reference signal to a mixed-signal circuit.

27. The method according to claim 22, further comprising supplying the at least one reference signal to a digital circuit.

28. The method according to claim 22, further comprising using the at least one reference signal in a programmable logic device (PLD).

29. The method according to claim 22, wherein using the at least one correction signal to generate the at least one reference signal comprises correcting an error component in the at least one reference signal.

* * * * *